(12) United States Patent
Shibata

(10) Patent No.: US 7,375,346 B2
(45) Date of Patent: May 20, 2008

(54) POSITIONING DEVICE AND METHOD OF INITIALIZING A POSITIONING DEVICE

(75) Inventor: Yugo Shibata, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 11/557,137

(22) Filed: Nov. 7, 2006

(65) Prior Publication Data

US 2007/0063149 A1    Mar. 22, 2007

Related U.S. Application Data

(62) Division of application No. 11/084,115, filed on Mar. 21, 2005, now Pat. No. 7,157,722.

(30) Foreign Application Priority Data

Mar. 25, 2004  (JP)  ............... 2004-089502

(51) Int. Cl.
*G05G 11/00* (2006.01)
(52) U.S. Cl. ............... 250/442.11; 355/72; 74/490.09
(58) Field of Classification Search ......... 250/442.11; 355/30, 53, 72, 220; 74/490.09, 479.01
See application file for complete search history.

(56) References Cited

U.S. PATENT DOCUMENTS

| 6,639,225 B2* | 10/2003 | Kirschstein et al. ... 250/442.11 |
| 6,788,385 B2* | 9/2004 | Tanaka et al. ........... 355/53 |
| 7,030,964 B2 | 4/2006 | Akutsu et al. .......... 355/53 |
| 2004/0112164 A1 | 6/2004 | Asano et al. ........ 74/490.09 |
| 2006/0028310 A1 | 2/2006 | Asano et al. ........... 335/220 |

FOREIGN PATENT DOCUMENTS

| JP | 5-64487 | 3/1993 |
| JP | 11-316607 | 11/1999 |

* cited by examiner

*Primary Examiner*—Kiet T. Nguyen
(74) *Attorney, Agent, or Firm*—Fitzpatrick, Cella, Harper & Scinto

(57) ABSTRACT

In order to realize initializing sequences with high accuracy and high reproducibility, a positioning device according includes an XY slider movable in directions X and Y, an object position measuring device for measuring the position of the XY slider, an X beam guiding the XY slider in the direction Y and movable in the direction X, a Y beam guiding the XY slider in the direction X and movable in the direction Y, electromagnet units having at least two pairs of electromagnets provided on the XY slider in such a manner as to embrace side faces of the X beam and the Y beam, and a rotation regulating portion provided on the X beam for regulating the rotation of the X beam.

9 Claims, 13 Drawing Sheets

POSITIONING DEVICE AND METHOD OF INITIALIZING A POSITIONING DEVICE

This application is a divisional application of U.S. patent application Ser. No. 11/084,115, filed Mar. 21, 2005, now U.S. Pat. No. 7,157,722.

BACKGROUND OF THE INVENTION

1. Field of the Invention

The present invention relates to a positioning device and a method of initializing a positioning device, preferably, to be used for semiconductor exposure devices, various kinds of machine tools, various kinds of precision measuring devices, and the like.

2. Description of the Related Art

FIG. 17 is a view illustrating a wafer stage 100 for a semiconductor exposure device (not shown) as an example of the prior art. FIG. 18 is a view illustrating part of the construction shown in FIG. 17, for ease of understanding.

As shown in FIG. 18, wafer stage 100 includes a stage surface plate 1, an X beam 2, a Y beam 4 and an XY slider 13 (see FIG. 17). The X beam 2, the Y beam 4 and the XY slider 13 are movably guided on the stage surface plate 1 by means of gas bearings (not shown), respectively The X beam 2 is movably guided along a side face of an X yaw guide 3 in a direction X by means of gas bearings (not shown). Similarly, the Y beam 4 is movably guided along a side face of a yaw guide 5 in a direction Y by means of gas bearings (not shown).

The X beam 2 and the Y beam 4 are provided at each of their both ends with a coarse linear motor moving part using permanent magnets. FIG. 17 shows that sets of X coarse linear motor stationary parts 8 and Y coarse linear motor stationary parts 9 are also provided in such a manner as to embrace the respective coarse linear motor moving parts from above and below. The coarse linear motor stationary parts 8 and 9 each comprise iron cores made of laminated silicon steel plates arranged in the form of comb teeth, and coils wound around the teeth. Although a magnetic attraction force may be exerted between the iron cores and the coarse linear motor moving parts, this magnetic attraction force is canceled by the arrangement of the stationary parts 8 and 9, embracing the moving parts with the same clearances from above and below. By suitably causing current to flow through the coils of the coarse linear motor stationary parts 8 and 9, a thrust force can be generated between the coarse linear motor stationary parts 8 and 9 and the coarse linear motor moving parts.

Positions of the X beam 2 and the Y beam 4 in their moving directions are measured by means of laser interferometers 83 and 84. The X beam 2 and the Y beam 4 are provided with corner cube reflecting surfaces (not shown), which reflect laser beams or radiation beams X1, X2, Y1 and Y2 irradiated from the laser interferometers 83 and 84. The X beam 2 and the Y beam 4 are positioned by driving and controlling the coarse linear motors on the basis of the values measured by the respective laser interferometers 83 and 84.

The XY slider 13 (FIG. 17) has an upper plate 15 (FIG. 18) and a bottom plate 14 (FIG. 18) and is arranged in such a manner as to surround the coarse motion X beam 2 and the Y beam 4. The self-weight of the XY slider 13 is supported by the stage surface plate 1 through gas bearings (not shown) provided on the bottom plate 14. Gas bearings 18 are provided between the XY slider 13 and the X and Y beams 2 and 4. The XY slider 13 is movably guided by the X beam 2 in the direction X and by the Y beam 4 in the direction Y, as a result of which, the XY slider 13 is moved in both the directions X and Y. FIG. 18 illustrates the stage with the X beam 2, the Y beam 4 and the upper plate 15 shifted in the direction Z (i.e., in the vertical direction).

Provided on the upper plate 15 (FIG. 18) are fine linear motors and a fine movement stage 16 (FIG. 17) through a self-weight supporting portion. The self-weight supporting portion includes gas bearings and magnets so that the fine movement stage 16 is insulated from vibration which would otherwise be transmitted thereto. The fine linear motor includes a linear motor stationary part provided on the XY slider 13 and a linear motor moving part provided on the fine movement stage 16. A single phase coil is provided as the linear motor stationary part, and a permanent magnet is provided as the linear motor moving part. The fine movement stage 16 is movable relative to the XY slider in the directions X, Y and Z, and directions ωx, ωy and θz, which are rotational directions about the axes X, Y and Z, by means of the fine linear motors.

The fine movement stage 16 is provided with a mirror having a reflecting surface (not shown). Positions (displacement) of the fine movement stage 16 having six freedoms of movement can be measured by reflecting a laser beam or a radiation beam at the reflecting surface of the stage 16 from a laser interferometer (not shown). The fine movement stage 16 is positioned by driving and controlling the fine linear motor on the basis of values measured by the respective laser interferometers.

In a case in which positions of an object are measured by the use of the laser interferometers, as described above, there is a need to initialize (to calibrate) positional data of the laser interferometers. This is because the interferometer measures relative positions of an object, but not absolute positions.

In general, the initialization may be carried out when turning on a power source. In a commonly-used method for initializing positional data, an object is moved to a reference position, whereupon the measured value is changed to a desired value. In this case, for example, a mechanical abutment or a shading switch may be used as a reference position.

In an initialization sequence, it is required to move an object to the reference position. The coarse linear motors may be operated in a system that selects polyphase coils to be energized. Methods for selecting coils to be energized are disclosed in Japanese Patent Application Laid-Open Nos. 64,487/1993 and 316,607/1999.

In order to move an object to a reference position, moreover, the object must be guided. In a case in which the XY slider 13, the X beam 2 and the Y beam 4 are guided with the aid of gas bearings, as described above, the guiding function can be given to the gas bearings by supplying gas to them when turning on the power source. In a case in which the XY slider 13, the X beam 2 and the Y beam 4 are guided by the use of electro-magnetic guidance, however, there is no guiding function when turning on the power source.

SUMMARY OF THE INVENTION

In view of the problems described above, an object of the present invention is to provide an improved arrangement and a sequence for initializing a relative position sensor in a positioning device having electro-magnetic guides.

In order to achieve the above object, the positioning device according to the invention comprises an object movable at least in directions X and Y, object position measuring means for measuring positions of the object, a first auxiliary structure guiding the object in the direction Y and movable in the direction X, a second auxiliary structure guiding the object in the direction X and movable in the direction Y, at least two pairs of electromagnet units provided on the object in such a manner as to embrace side faces of the first auxiliary structure and the second auxiliary structure, and a rotation regulating portion for regulating the rotation of at least one of the first and second auxiliary structures.

In this case, the positioning device preferably has magnetic members provided on side faces of the first and second auxiliary structures to produce attracting forces between the magnetic members and the electromagnet units. Moreover, the positioning device according to the invention may comprise first position measuring means for measuring positions of the first auxiliary structure in the direction X and second position measuring means for measuring positions of the second auxiliary structure in the direction Y.

In another aspect of the invention, a method of initializing a positioning device electro-magnetically guiding an object along two orthogonal beams comprises a step of regulating rotation of one of the beams and a step of causing the beam regulated in rotation and the object to be electro-magnetically attracted.

The method of initializing a positioning device according to the invention preferably comprises at least one of a step of offsetting a position measuring device for measuring a position of the object when the object is attracted, a step of attracting the other beam to the object under a condition maintaining the object and the one beam in a predetermined relative positional relationship, and a step of moving the other beam to a predetermined reference position under a condition maintaining the object and the one beam in a predetermined relative positional relationship.

Moreover, an exposure device according to the invention may be an exposure device comprising any of the positioning devices described above, or an exposure device for positioning at least one of a substrate and a negative plate by means of a stage using any of the initializing methods described above. Further, the invention is also applicable to a method of producing a device comprising a step of producing the device by the use of any of the exposure devices described above.

Further features and advantages of the present invention will become apparent from the following description of exemplary embodiments (with reference to the attached drawings).

DESCRIPTION OF THE EMBODIMENTS

Embodiment 1

Figure 1:
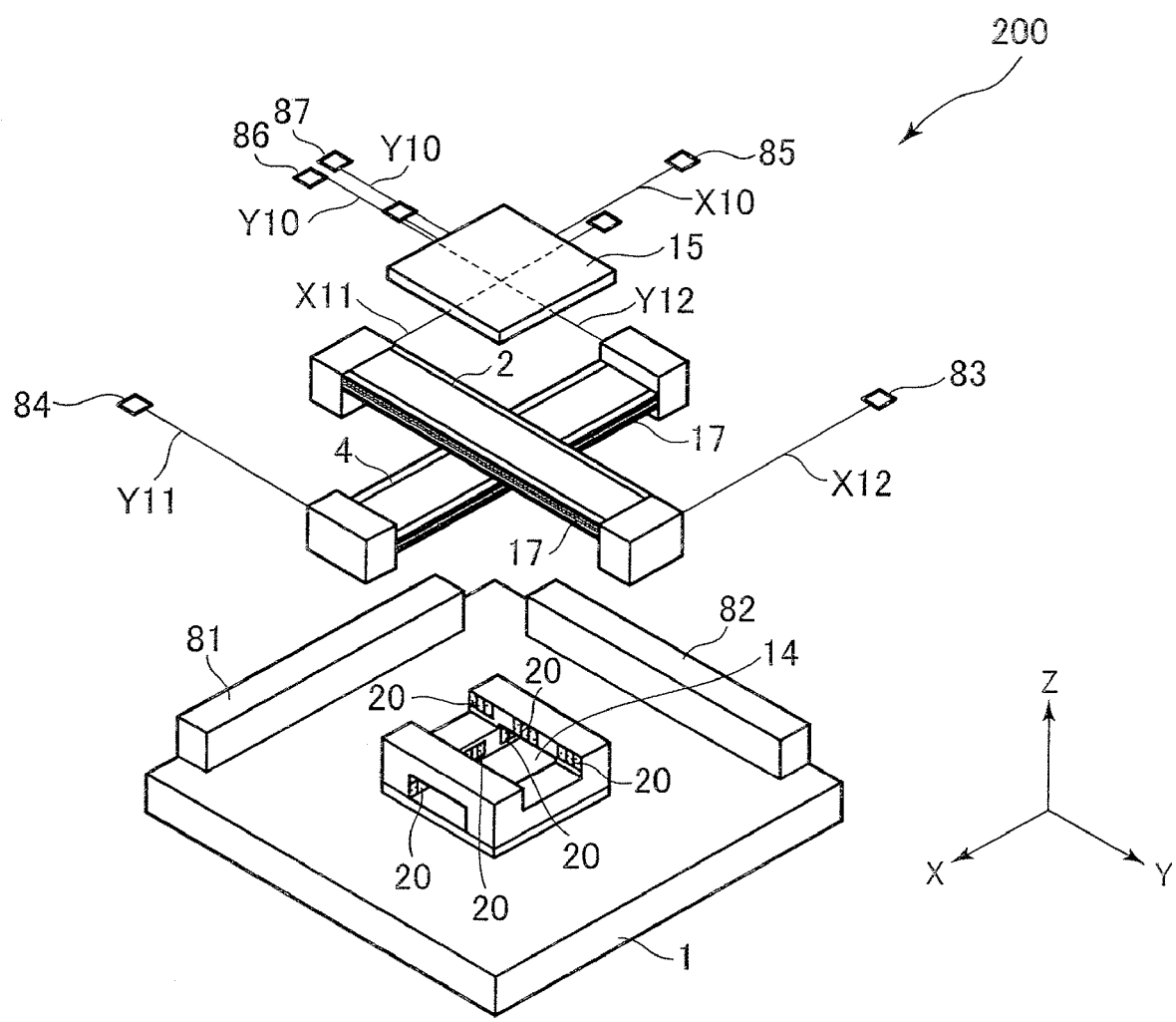
FIG. 1 is a perspective view illustrating the construction of a stage using an electro-magnetic guide with which an embodiment of the invention is concerned.

FIG. 1 is a perspective view for explaining a wafer stage 200 of the semiconductor exposure device according to the first embodiment of the invention. The constructions of a coarse linear motor and a fine linear motor will not be described because they are similar to those shown in FIG. 17. The differences of the first embodiment of the invention from those arrangements shown in FIGS. 17 and 18 will be mainly explained here.

Figure 17:
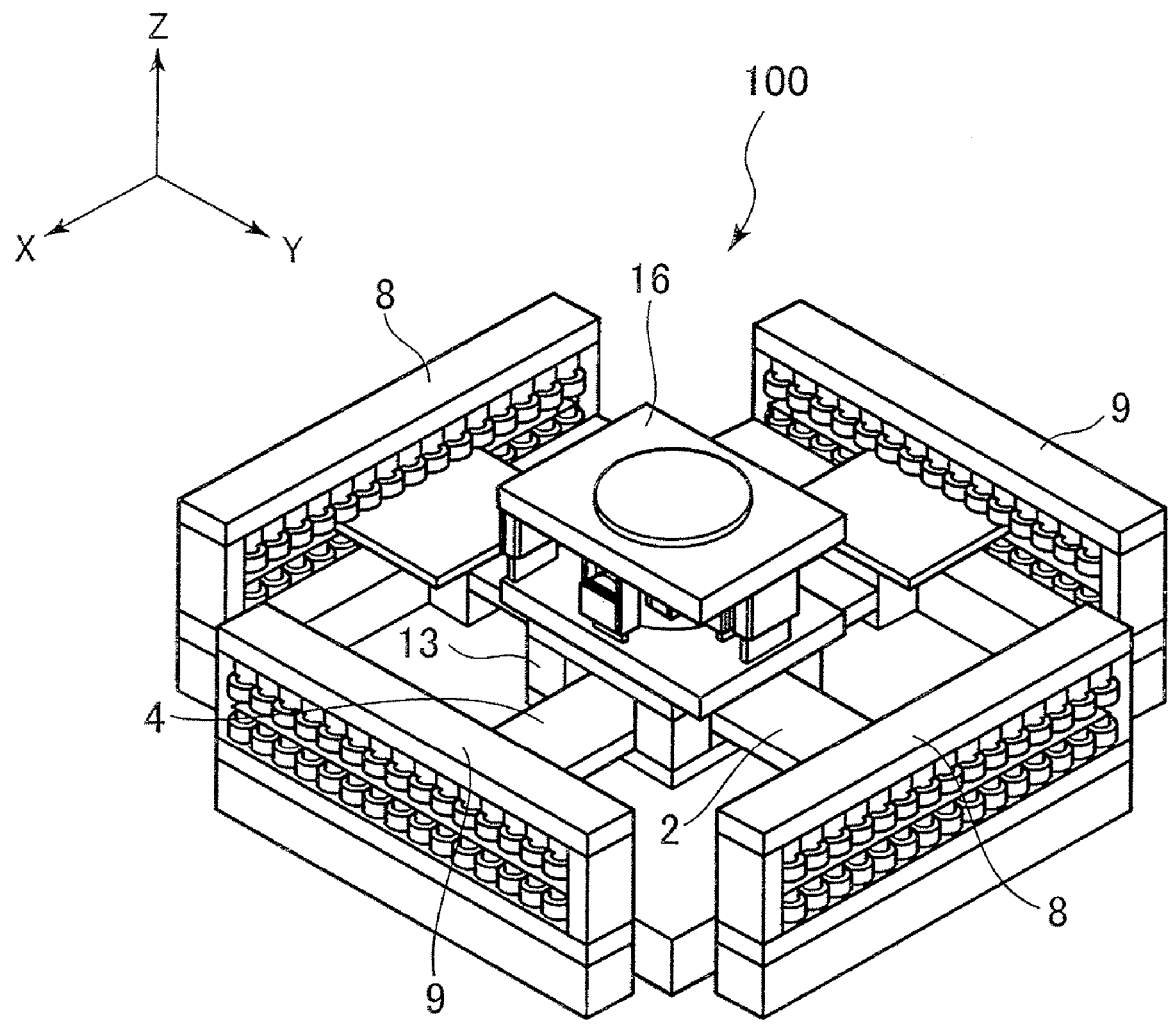
FIG. 17 is a conceptual perspective view of a wafer stage of a known semiconductor exposure device.
Figure 18:
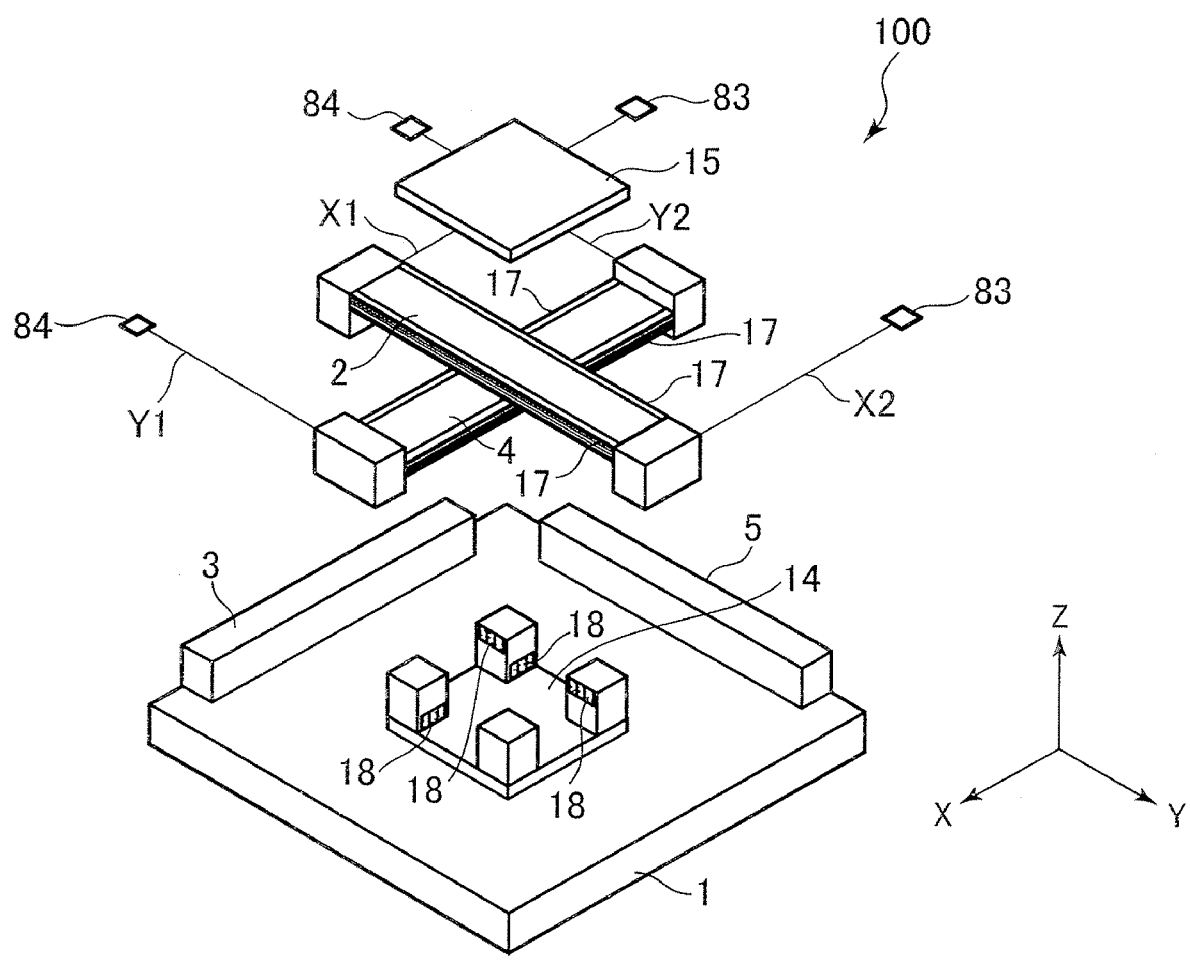
FIG. 18 is a perspective view illustrating a known stage construction using gas bearings.

The wafer stage 200 includes a stage surface plate 1, an X beam 2, a Y beam 4 and an XY slider (not shown—see element 13 in FIG. 17). An electro-magnetic guide is provided between the XY slider and the X beam 2 and Y beam 4. For the sake of clarity, FIG. 1 illustrates the electro-magnetic guide with its components shifted in the direction Z. The electro-magnetic guide is a guiding mechanism utilizing the attraction of an electro-magnetic actuator (discussed below). The X beam 2 and Y beam 4 are provided at their side faces with targets (guide faces) 17 formed from laminated silicon steel sheets. The targets 17 are made in a laminated construction in order to prevent the influence of an eddy current. A plurality of electromagnets 20 as the electro-magnetic actuators each includes an E-shaped core and coils wound about the core. The electromagnets 20 are arranged so as to embrace the X beam 2 and Y beam 4. On causing current to flow through the coils, magnetic flux lines pass through the core and the targets to cause attraction therebetween.

Figure 2:
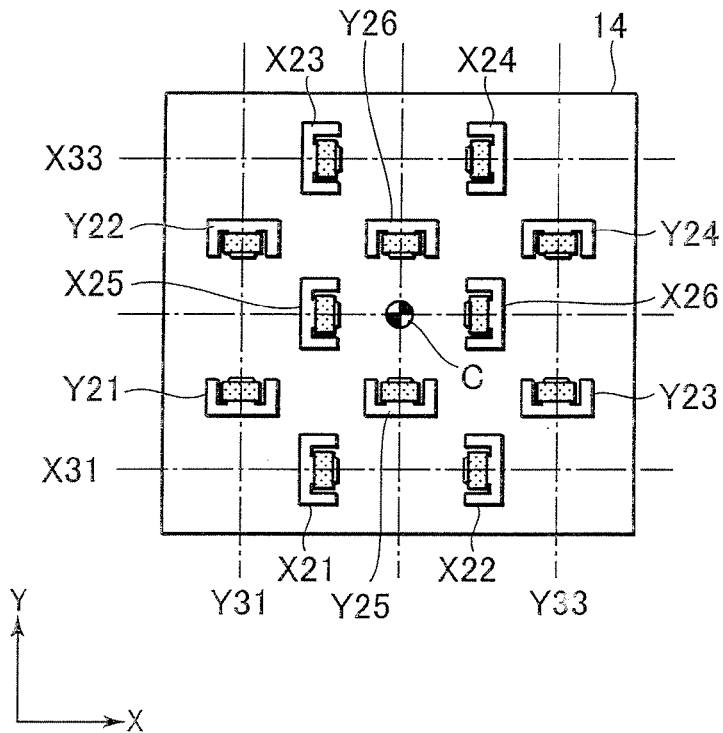
FIG. 2 is a plan view of an arrangement of electromagnets for the electro-magnetic guide in the stage of the first embodiment of the invention.

The electromagnets 20 are used as electromagnet units of two opposed electromagnets in order to produce the attraction only. As shown in FIG. 2, the electromagnet unit includes, for example, an X electromagnet X21 and an X electromagnet X22, and an X electromagnet X23 and an X electromagnet X24. A line connecting the centers of the X electromagnet X21 and X electromagnet X22 is here defined as an X axis X31, and a line connecting the centers of the X electromagnet X23 and the X electromagnet X24 is defined as an X axis X33. The X axis X31 is a line of force of the X electromagnet X21 and the X electromagnet X22, while the X axis X33 is a line of force of the X electromagnet X23 and the X electromagnet X24. In the direction Y, similarly, a line connecting the centers of the Y electromagnet Y21 and the Y electromagnet Y22 is defined as a Y axis Y31, and a line connecting the centers of the Y electromagnet Y23 and the Y electromagnet Y24 is defined as a Y axis Y33. The Y axis Y31 is a line of force of the Y electromagnet Y21 and the Y electromagnet Y22, while the Y axis Y33 is a line of force of the Y electromagnet Y23 and the Y electromagnet Y24.

A controller produces control commands for the respective electromagnet units on the basis of command values for the XY slider and measured values of positions of the XY slider. Positioning of the XY slider can be carried out based on the produced control commands from the controller.

As shown in FIG. 1, an XY slider upper plate 15 is provided on its side faces with mirror reflectors to reflect one laser beam in the direction X (X laser optical axis) and two laser beams in the direction Y (Y1 laser optical axis and Y2 laser optical axis Y10) from laser interferometers 85 to 87 to measure positions in the directions X, Y and θz of the XY slider. The position in the direction θz can be calculated as a difference between the two measured values in the direction Y from the spacing between the laser beams.

FIG. 2 is a plan view of the wafer stage, illustrating the arrangement of the electromagnets 20. Three pairs of electromagnets are provided for guidance in the direction X, and three pairs of electromagnets are provided for guidance in the direction Y.

Figure 3:
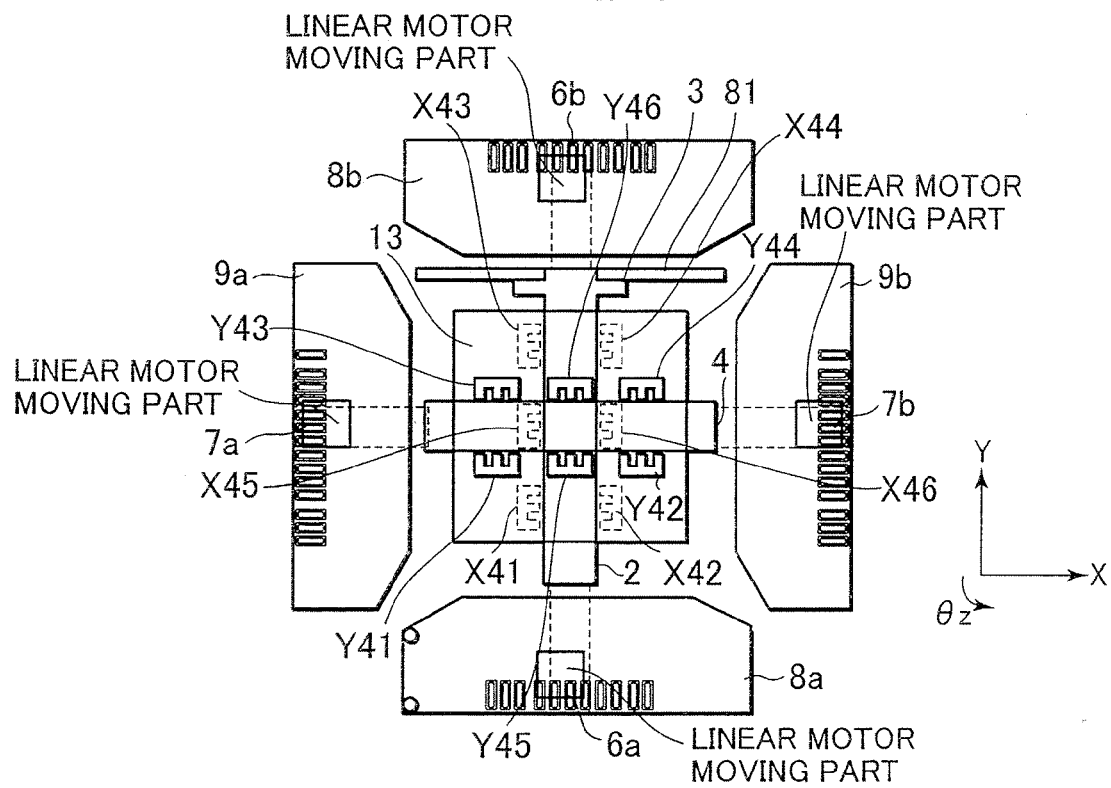
FIG. 3 is a conceptual plan view of the stage with which the first embodiment of the invention is concerned.
Figure 4:
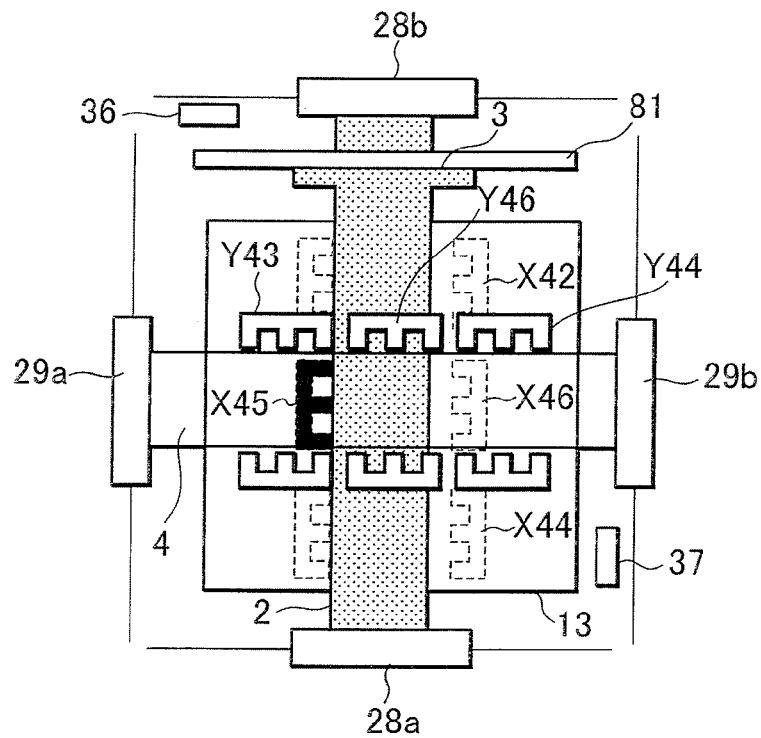
FIG. 4 is an explanatory plan view of a first initializing step of the initializing sequence in the first embodiment of the invention.

FIGS. 3 and 4 are plan views of the wafer stage. For the sake of clarity, the internal construction is made visible, as if the XY slider 13 were transparent. The X beam 2 has a rotation regulating portion 3. The X beam 2 is movable in the direction Y by means of linear motors 28a and 28b (see FIG. 4). The linear motor 28a has a moving part 6a and a stationary part 8a, the linear motor 28b has a moving part 6b and a stationary part 8b (see FIG. 3). The Y beam 4 is movable in the direction X by means of linear motors 29a and 29b (see FIG. 4). The linear motor 29a has a moving part 7a and a stationary part 9a, and the linear motor 29b has a moving part 7b and a stationary part 9b (see FIG. 3). The XY slider 13 is provided with electromagnets X41 to X46 so as to embrace the X beam 2 and with electromagnets Y41 to Y46 so as to embrace the Y beam 4.

Initializing sequences will be explained with reference to FIGS. 4 to 8 hereinafter.

Generally speaking, in contrast with a wafer stage provided with gas bearings between the XY slider and the X and Y beams 2 and 4, in a wafer stage provided with an electro-magnetic guide, the XY slider 13 does not have the guiding function when the power source is turned on, so that it is impossible to drive the stage to be initialized. In the present invention, accordingly, initializing sequences for initializing the stage including initialization of the electromagnetic guide will be proposed.

(Step 1) As shown in FIG. 4, the rotation of the X beam 2 in the direction θz is regulated by abutment of the rotation regulating portion 3 against the guide 81. Under the condition of the abutment, the X beam 2 is landed and the XY slider 13 is attracted to the X beam 2 by the use of at least one electromagnet (e.g., the electromagnet X45 as viewed in FIG. 4) of the XY slider 13. Under the attracted condition, the measured value of the position of the XY slider 13 in the direction θz is reset, while the measured values of the positions of the X beam 2 and the XY slider 13 in the direction X are temporarily reset.

Figure 5:
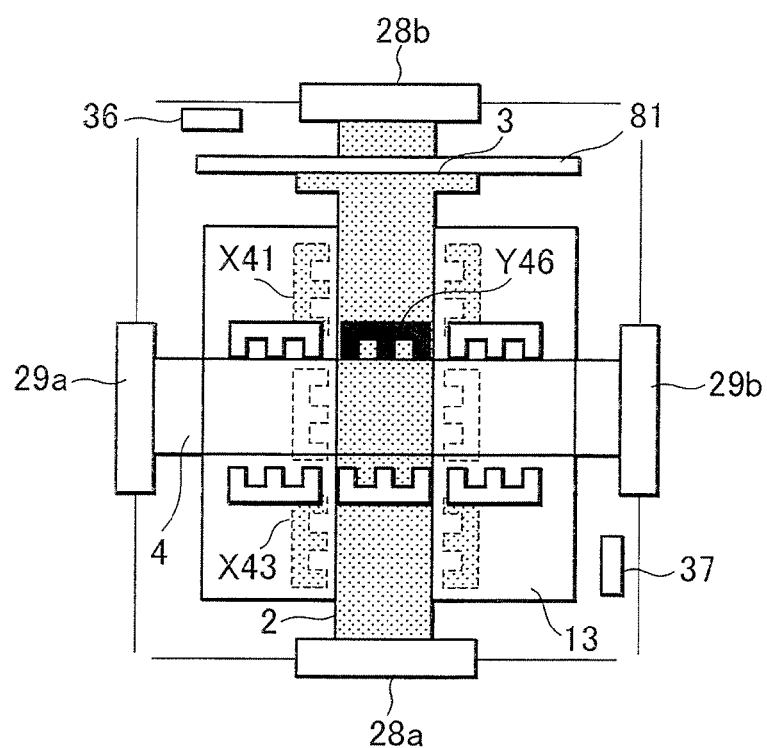
FIG. 5 is an explanatory plan view of a second initializing step of the initializing sequence in the first embodiment of the invention.

(Step 2) As shown in FIG. 5, a position servo is applied to the XY slider 13 in the directions θz and X by the use of at least two pairs of electromagnets (X41 and X43 in FIG. 5) and then, the slider 13 is attracted to the Y beam 4 by the use of at least one electromagnet of the XY slider 13 (e.g., Y46 in FIG. 5).

Figure 6:
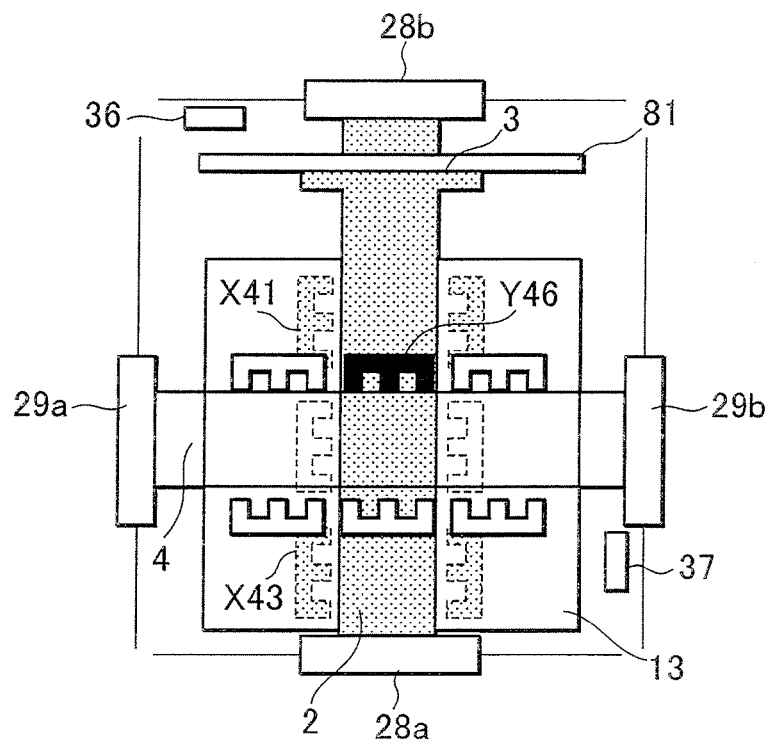
FIG. 6 is an explanatory plan view of a third initializing step of the initializing sequence in the first embodiment of the invention.

(Step 3) As to initialization of the measured values of the positions in the direction Y, the method disclosed in Japanese Patent Application Laid-Open No. 316,607/1999 may be used. In more detail, as shown in FIG. 6, under the condition of the Y beam 4 and the XY slider 13 being attracted to each other, the Y beam 4 is moved to a reference position, whereupon measured values of positions of the Y beam 4 in the directions Y and θz and of the XY slider 13 in the direction Y are simultaneously reset at the reference position.

Figure 7:
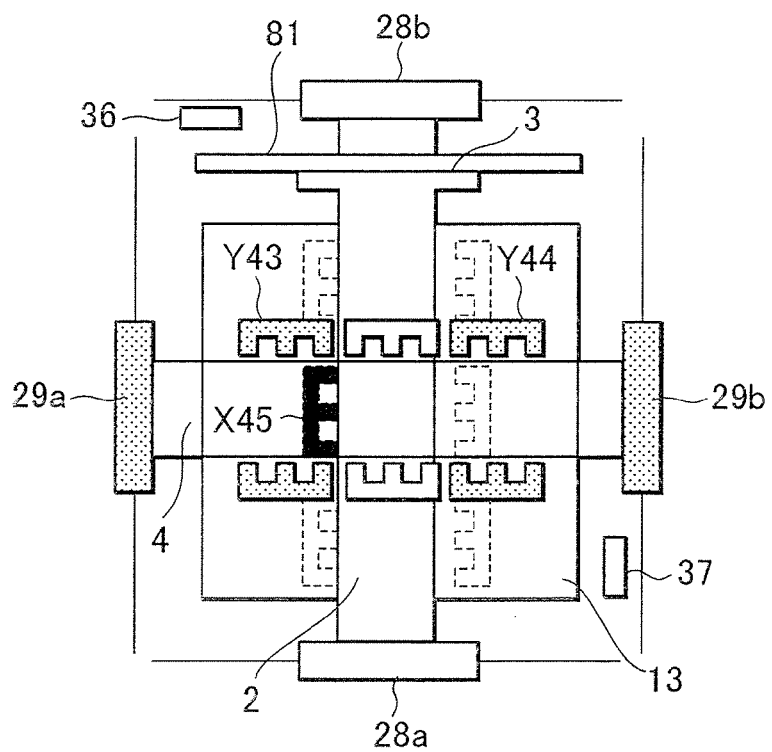
FIG. 7 is an explanatory plan view of a fourth initializing step of the initializing sequence in the first embodiment of the invention.

(Step 4) As shown in FIG. 7, a position servo is applied to the Y beam 4 in the directions Y and θz. And, the position servo applied to the XY slider 13 in the directions X and θz by means of at least two sets of X electromagnets is turned off, while a position servo is applied to the XY slider 13 in the direction θz by means of at least two sets of Y electromagnets Y43 and Y44. The X beam 2, which has been landed, is lifted, and the XY slider 13 is attracted to the X beam 2 by the use of at least one X electromagnet X45.

Figure 8:
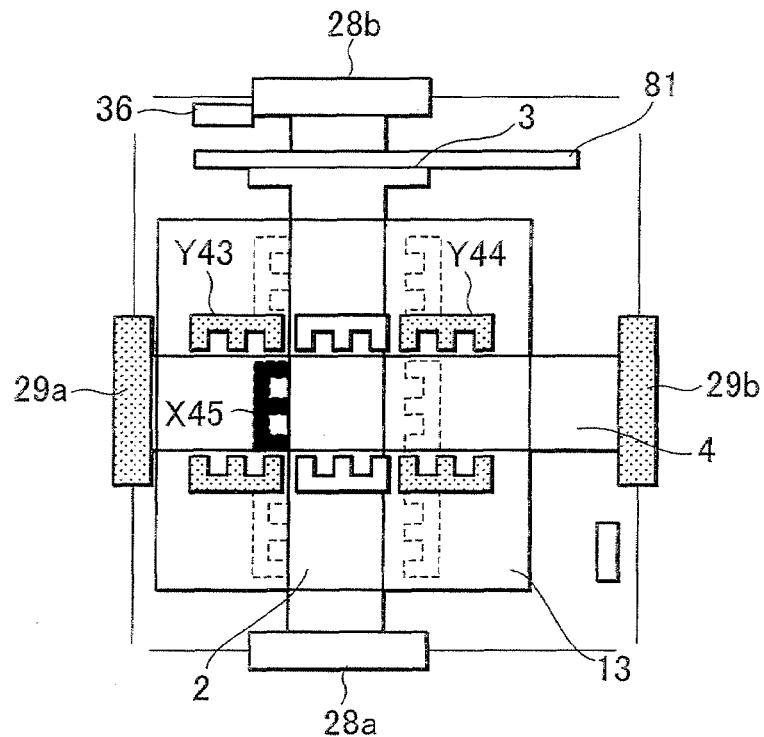
FIG. 8 is an explanatory plan view of a fifth initializing step of the initializing sequence in the first embodiment of the invention.

(Step 5) As to initialization of the measured values of the positions in the direction X, a method disclosed in Japanese Patent Application Laid-Open No. 316,607/1999 may be used. In more detail, as shown in FIG. 8, under the condition of the X beam 2 and the XY slider 13 being attracted to each other, the X beam 2 is moved to the reference position, whereupon the measured values of the positions of the X beam 2 in the direction X and of the XY slider 13 in the direction X are simultaneously reset at the reference position.

By carrying out Steps 1 to 5 described above, the initialization of the laser interferometer is completed in the direction X of the X beam 2 (i.e., rotation in the direction θz is regulated by the rotation regulating portion 3), in the directions Y and θz of the Y beam 4, and in the directions X, Y and θz of the XY slider 13. In order to judge whether the X beam 2, the Y beam 4 and the XY slider 13 have arrived at the respective reference position, reference position judging means 36 and 37 may be used. As means for judging the reference position, various means may be effected such as, for example, (a) providing a shade on the beam and providing a photo-interrupter at the reference position, (b) providing a mechanical switch, such as a lever switch at the reference position, and (c) providing an abutment stopper adapted to abut against the reference position.

In Step 1, moreover, after the XY slider 13 has been attracted to the X beam 2, the XY slider 13 may be attracted to the Y beam 4, as well. The Y beam 4 is landed and after the initialization in the direction X has been carried out according to Steps 4 and 5, the initialization in the direction Y may be effected according to Steps 2 and 3. In this case, the Y beam 4 is landed, instead of a position servo being applied to the Y beam 4 in Step 4. And in Step 2, a position servo is applied to the X beam 2, instead of the X beam 2 being landed, and Step 3 is carried out.

Embodiment 2

Figure 9:
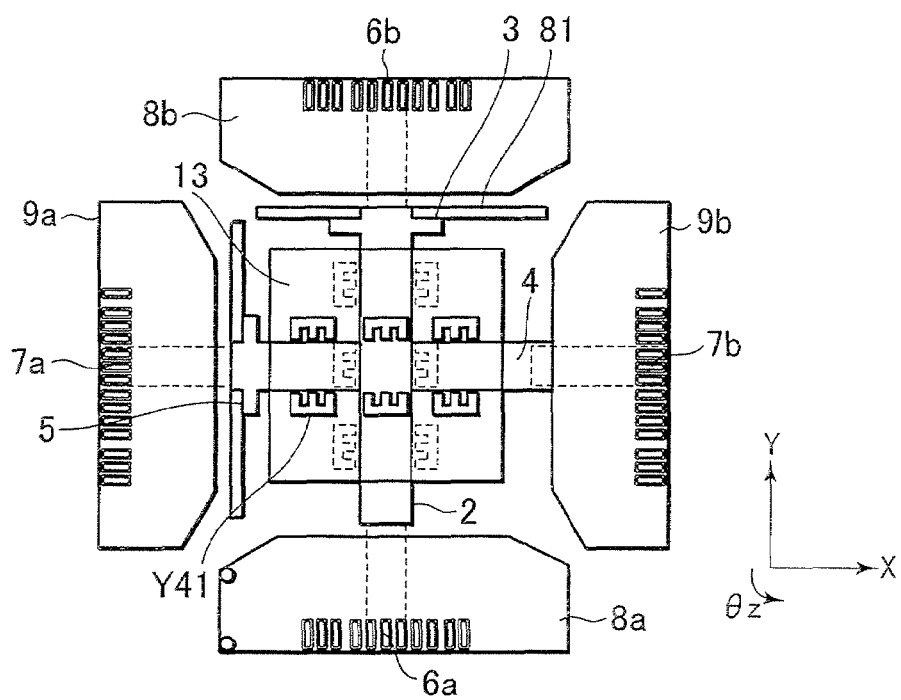
FIG. 9 is a conceptual plan view of the stage with which a second embodiment of the invention is concerned.

FIG. 9 is a conceptual plan view for explaining a wafer stage for a wafer exposure device with which the first embodiment is concerned. For the sake of clarity, the internal components are made visible, as if the XY slider 13 were transparent. In the second embodiment, the X beam 2 and the Y beam 4 are provided with yaw guides. Similar components and functions to those of the first embodiment will not be explained.

The initializing sequences in the second embodiment will be explained with reference to FIGS. 10 to 14, hereinafter.

Figure 10:
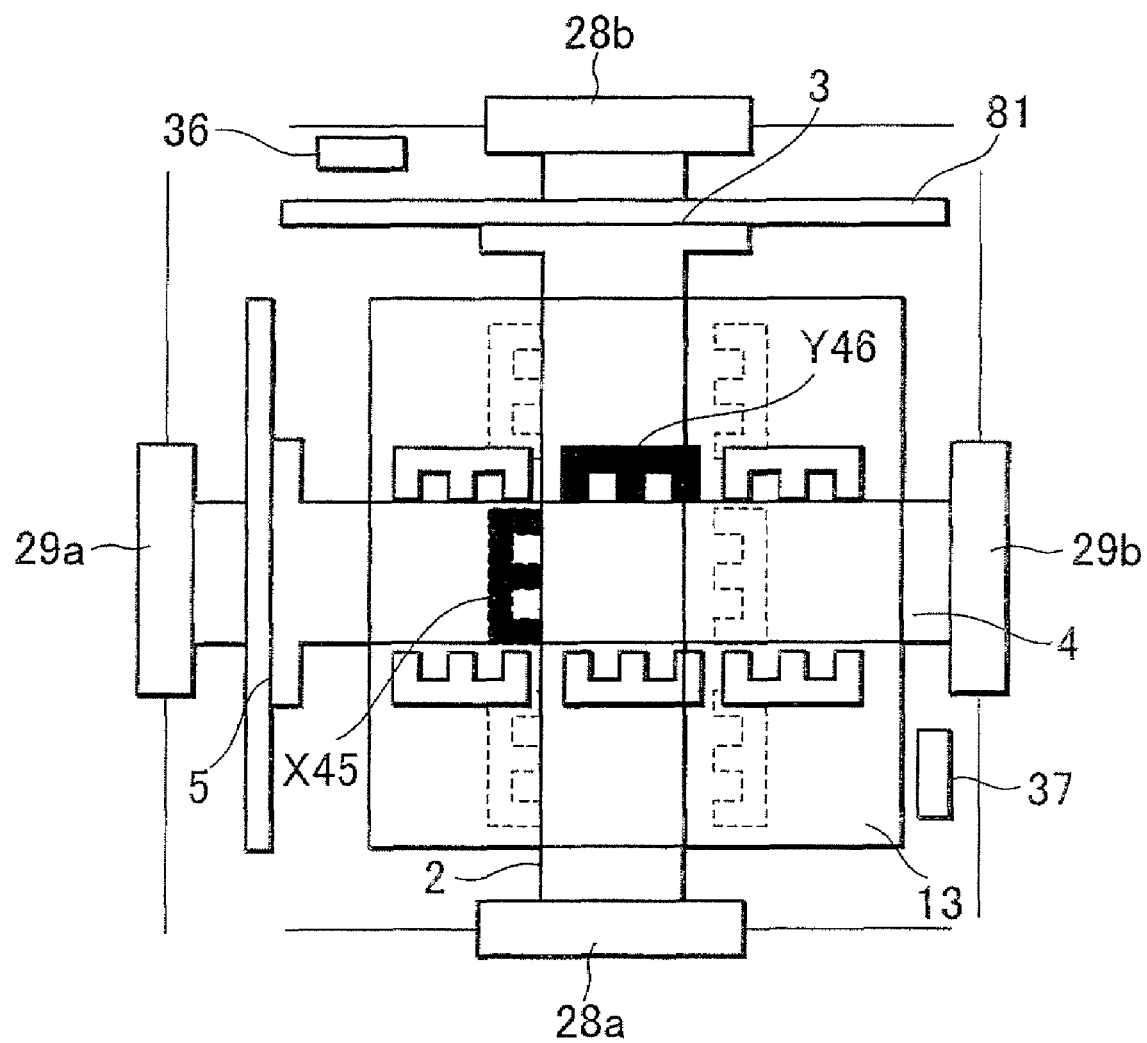
FIG. 10 is an explanatory plan view of a first initializing step of the initializing sequence in the second embodiment of the invention.

(Step 1) As shown in FIG. 10, the rotation of the X beam 2 in the direction θz is regulated by abutment of the rotation regulating portion 3 against the guide, while the rotation of the Y beam 4 in the direction θz is regulated by abutment of the rotation regulating portion 5 against the guide. Both the X beam 2 and the Y beam 4 are attracted to the XY slider 13 by the use of at least one respective electromagnet (e.g., X45 and Y46 shown in FIG. 10). Under this condition, position measuring means for the XY slider 13 in the direction θz is reset, and position measuring means for the X beam 2 in the direction X, the Y beam 4 in the direction Y and the XY slider 13 in the directions X and Y are temporarily reset.

Figure 11:
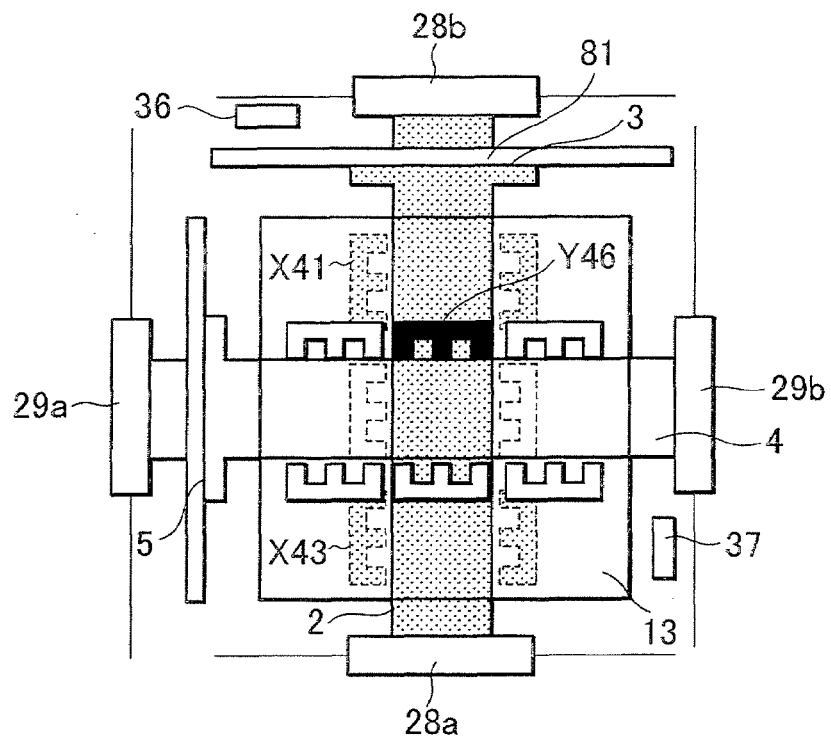
FIG. 11 is an explanatory plan view of a second initializing step of the initializing sequence in the second embodiment of the invention.

(Step 2) As shown in FIG. 11, the X beam 2 is landed and a position servo is applied to the XY slider 13 in the directions θz and X by the use of at least two sets of X electromagnets (e.g., X41 and X43 shown in FIG. 11) of the XY slider 13. The XY slider 13 is then attracted to the Y beam 4 by the use of at least one Y electromagnet (e.g., Y46 shown in FIG. 11) of the XY slider 13.

Figure 12:
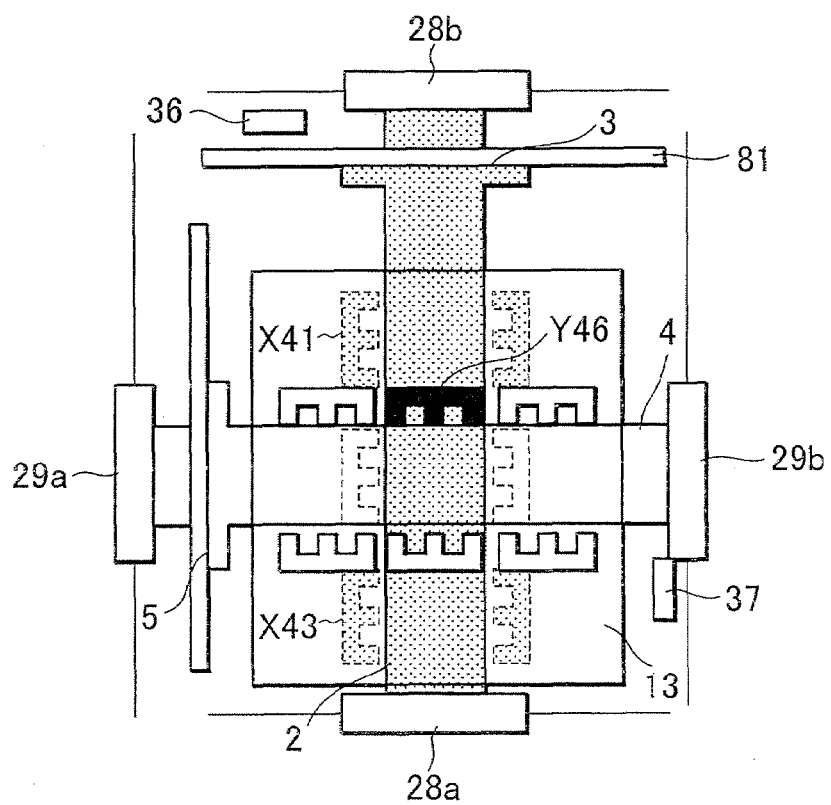
FIG. 12 is an explanatory plan view of a third initializing step of the initializing sequence in the second embodiment of the invention.

(Step 3) As to the initialization of the measured values of the positions in the direction Y, the method disclosed in Japanese Patent Application Laid-Open No. 316,607/1999 may be used. In more detail, as shown in FIG. 12, under the condition of the Y beam 4 and the XY slider 13 being attracted to each other, the Y beam 4 is moved to the reference position, whereupon the measured values of the positions of the Y beam 4 in the direction Y and of the XY slider 13 in the direction Y are simultaneously reset at the reference position.

Figure 13:
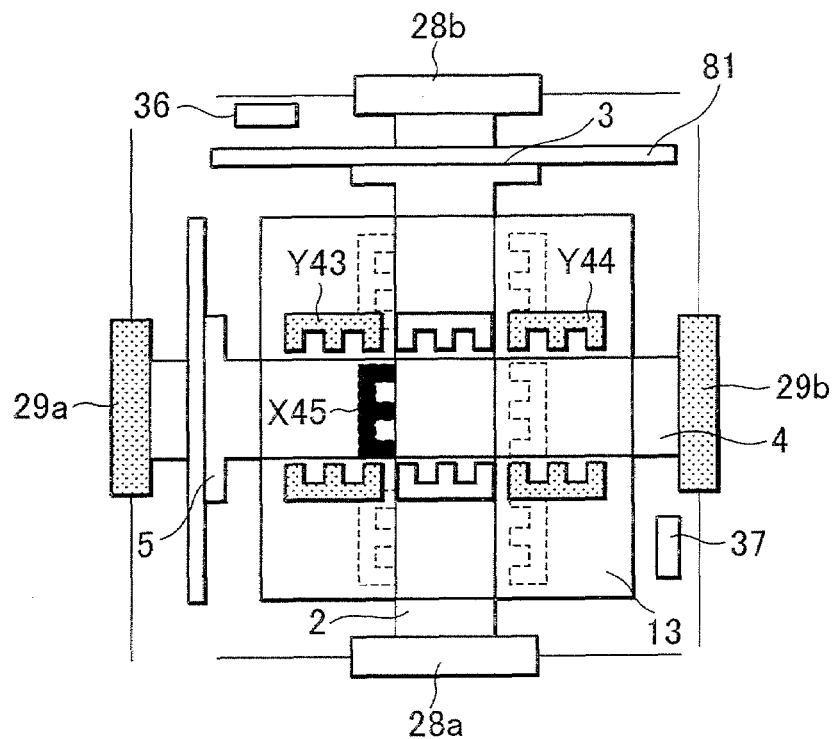
FIG. 13 is an explanatory plan view of a fourth initializing step of the initializing sequence in the second embodiment of the invention.
Figure 14:
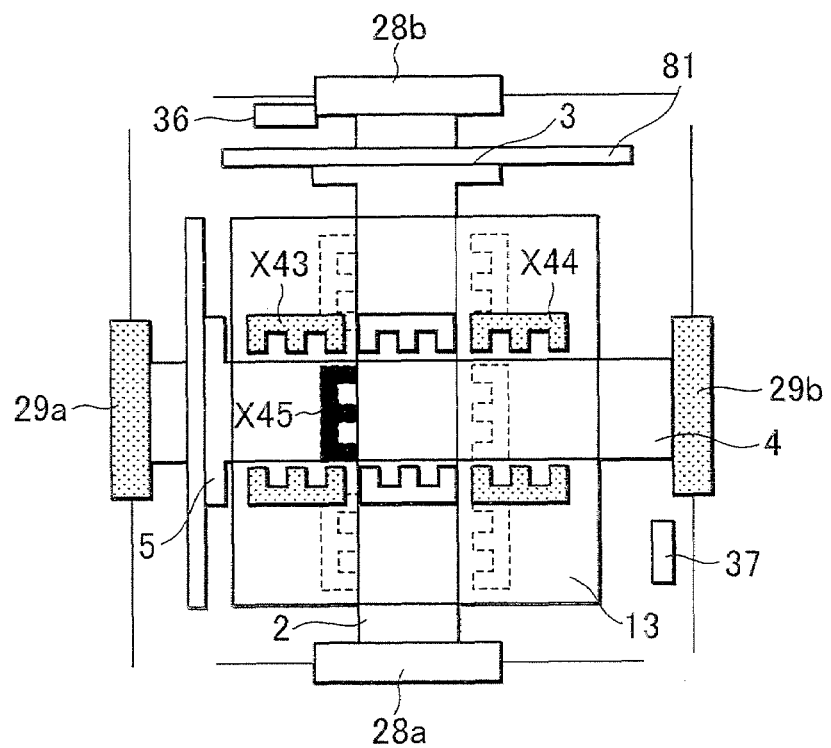
FIG. 14 is an explanatory plan view of a fifth initializing step of the initializing sequence in the second embodiment of the invention.

(Step 4) As shown in FIG. 13, a position servo is applied to the Y beam 4 in the direction Y. The position servo applied to the XY slider 13 in the directions X and θz by means of at least two sets of electromagnets on the side of the X beam 2 is turned off, and a position servo is applied to the XY slider 13 in the direction θz by means of at least two sets of electromagnets on the side of the Y beam 4. The X beam 2, which has been landed, is lifted, and the XY slider 13 is attracted to the X beam 2 by the use of at least one, for example, X electromagnet X45 on the side of the X beam 2.

(Step 5) As to the initialization of the measured values of the positions in the direction X, the method disclosed in Japanese Patent Application Laid-Open No. 316,607/1999 may be used. In more detail, as shown in FIG. 8, under the condition of the X beam 2 and the XY slider 13 being attracted to each other, the X beam 2 is moved to the reference position judging means 37, whereupon the measured values of the positions of the X beam 2 in the direction X and of the XY slider 13 in the direction X are simultaneously reset at the reference position judging means 37.

According to Steps 1 to 5, the initialization of the laser interferometer is completed in the direction X of the X beam 2 (the rotation in the direction θz is regulated by the rotation regulating portion 3), in the direction Y of the Y beam 4 (the rotation in the direction θz is regulated by the rotation regulating portion 5), in the directions X, Y and θz of the XY slider 13. In order to judge whether the X beam 2, the Y beam 4 and the XY slider 13 have arrived at the reference position, reference position judging means 36 and 37 may be used. As means for judging the reference position, various means may be effected such as, for example, (a) providing a shade on the beam and providing a photo-interrupter at the reference position, (b) providing a mechanical switch, such as a lever switch at the reference position, and (c) providing an abutment stopper adapted to abut against the reference position.

Moreover, Steps 2 and 3 may be performed after the initialization in the direction X in Steps 4 and 5 has been performed. In such a case, in Step 4, the Y beam 4 is landed and the initialization is performed in advance, instead of a position servo being applied to the Y beam 4. Then, in Step 2, a position servo is applied to the X beam 2 in the direction X, instead of the landing of the X beam 2, and Step 3 is performed.

The electromagnets for the attraction are not limited to the electromagnets illustrated in the drawings of the embodiments, and, for the attraction, a plurality of electromagnets or all the electromagnets may be used. The electromagnets for carrying out the position servo are not limited to the two sets of electromagnets illustrated in the drawings of the embodiments, and any combination of electromagnets or all the electromagnets may be used.

Figure 15:
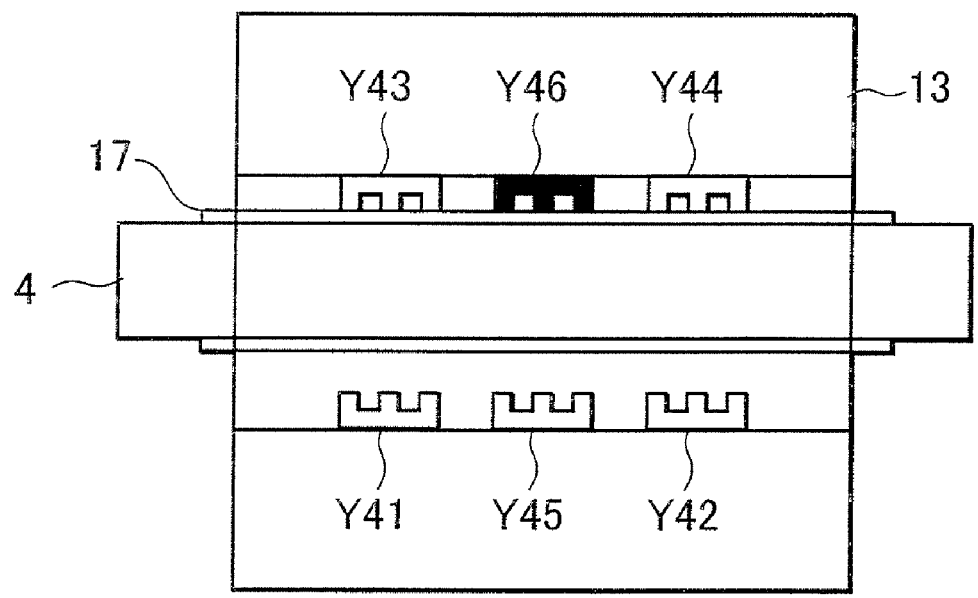
FIG. 15 is an explanatory view of a first attraction example of an electro-magnetic guide.
Figure 16:
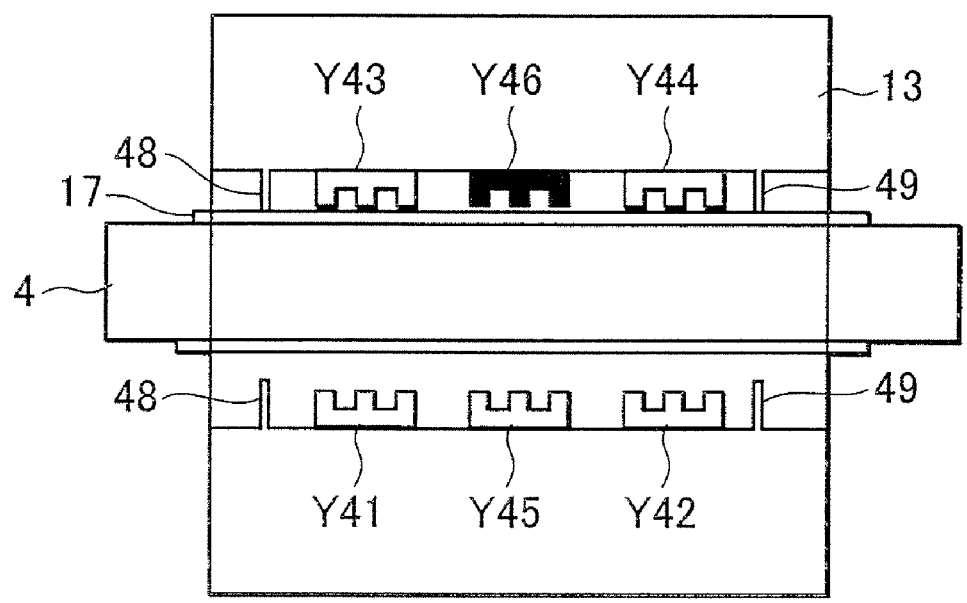
FIG. 16 is an explanatory view of a second attraction example of an electro-magnetic guide.

In performing the attraction by the electro-magnetic guide of the XY slider 13, moreover, as shown in FIG. 15, the attraction may be carried out in such a manner that, for example, the target 17 of the Y beam 4 is brought into close contact with the faces of the electromagnets Y43, Y44 and Y46. As shown in FIG. 16, further, at least two stoppers 48 and 49 may be bought into contact with the target surface to perform the attraction. In this case, it may be desired to arrange the stoppers 48 and 49 outside the electromagnets to be used for the attraction.

Embodiment 3

Figure 19:
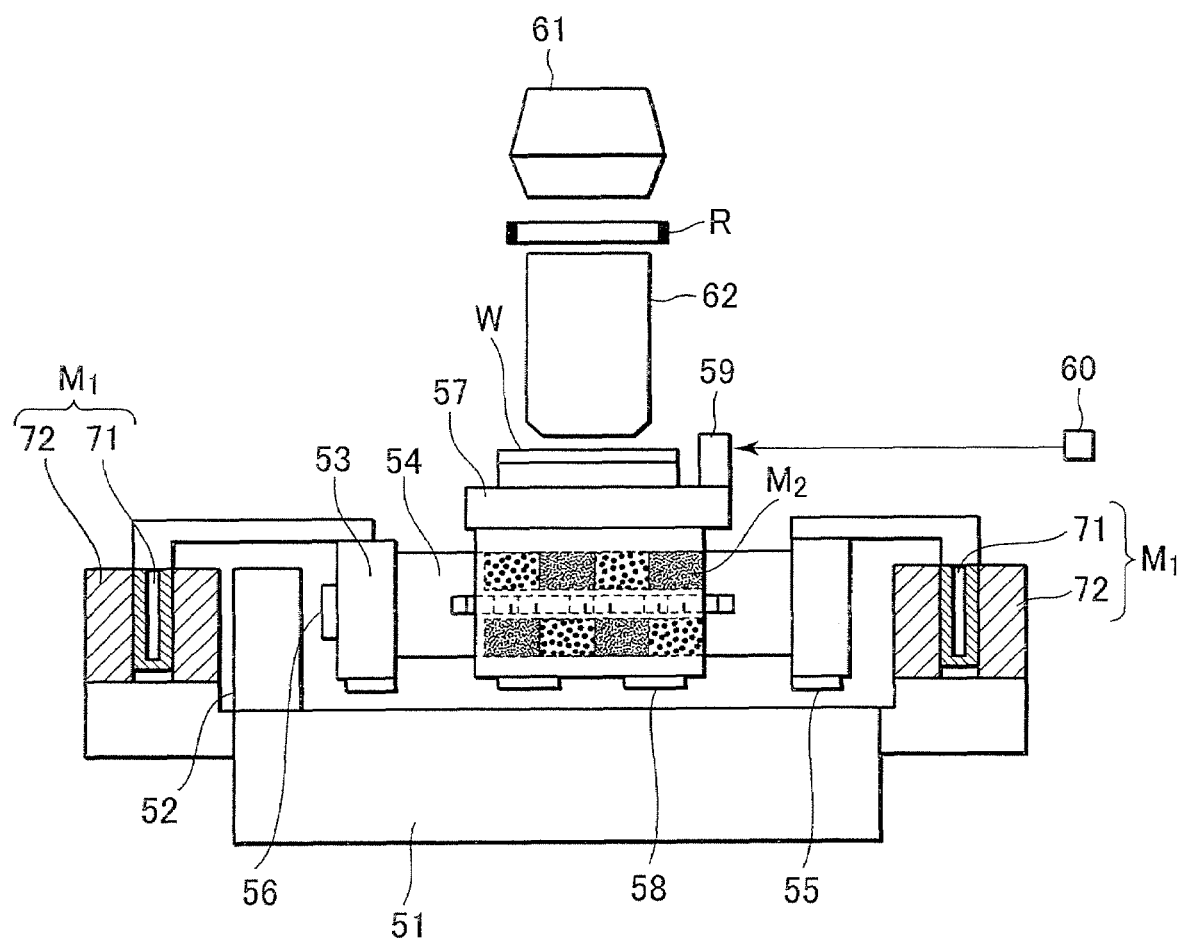
FIG. 19 is a front elevation illustrating an exposure device for producing semiconductor devices, including the stage as a wafer stage having the positioning device with which the present invention is concerned.

FIG. 19 illustrates an exposure device, for producing semiconductors, having a wafer stage 57 as a stage having the positioning device described above.

This exposure device is utilized in producing semiconductor devices for semiconductor integrated circuits, and devices formed with fine patterns, such as micro machines, microfilm magnetic heads, and the like. Desired patterns are formed on a substrate by irradiating an exposure light as exposure energy from a light source 61 through a reticle R, as a negative plate, and through a projection lens, as a projection system, onto a semiconductor wafer W as a substrate. The term "exposure light" is a general term for visible light, ultra violet light, EUV, X-rays, electron beams, charged particle beams, and the like. The term "projection lens" is a general term for a dioptric lens, a reflecting lens, a reflecting dioptric lens system, a charged particle lens, and the like.

In the exposure device, a guide 52 and a linear motor stationary part 72 of each of the linear motors are fixedly provided on a surface plate 51. The linear motor stationary part 72 has polyphase electro-magnetic coils and the linear motor moving part 71 of each of the linear motors has permanent magnets. Each of the linear motor moving parts 71, as a movable portion 53, is connected to a movable guide 54, as a stage, so that the linear motors Ml are energized to move the movable guides 54 in the direction of the normal line of the drawing. The movable portion 53 is supported by gas bearings 55 along the upper surface of the surface plate 51 as a reference, and is also supported by gas bearings 56 along the side surface of the guide 52 as a further reference.

Supported by gas bearings 58 is a movable (wafer) stage 57, which is a stage arranged to bridge between the movable guides 54 and be supported by gas bearings 58. The movable stage 57 is driven by linear motors M2, similar to the linear motors described above, and moved along the movable guide 54 as a reference in the right and left direction viewed in the drawing. The movement of the movable stage 57 is measured by the use of a mirror 59 fixed to the movable stage 57 and an interferometer 60.

A wafer W, as a substrate, is held in chucks mounted on the movable stage 57. Patterns of a reticle R, as a negative plate, are transcribed in a reduced scale in respective regions on the wafer W in a step-and-repeat or a step-and-scan process.

Moreover, the positioning device according to the present invention is also applicable to an exposure device of a type in which circuit patterns are directly transcribed on a semiconductor wafer by exposing a resist without using a mask.

Figure 20:
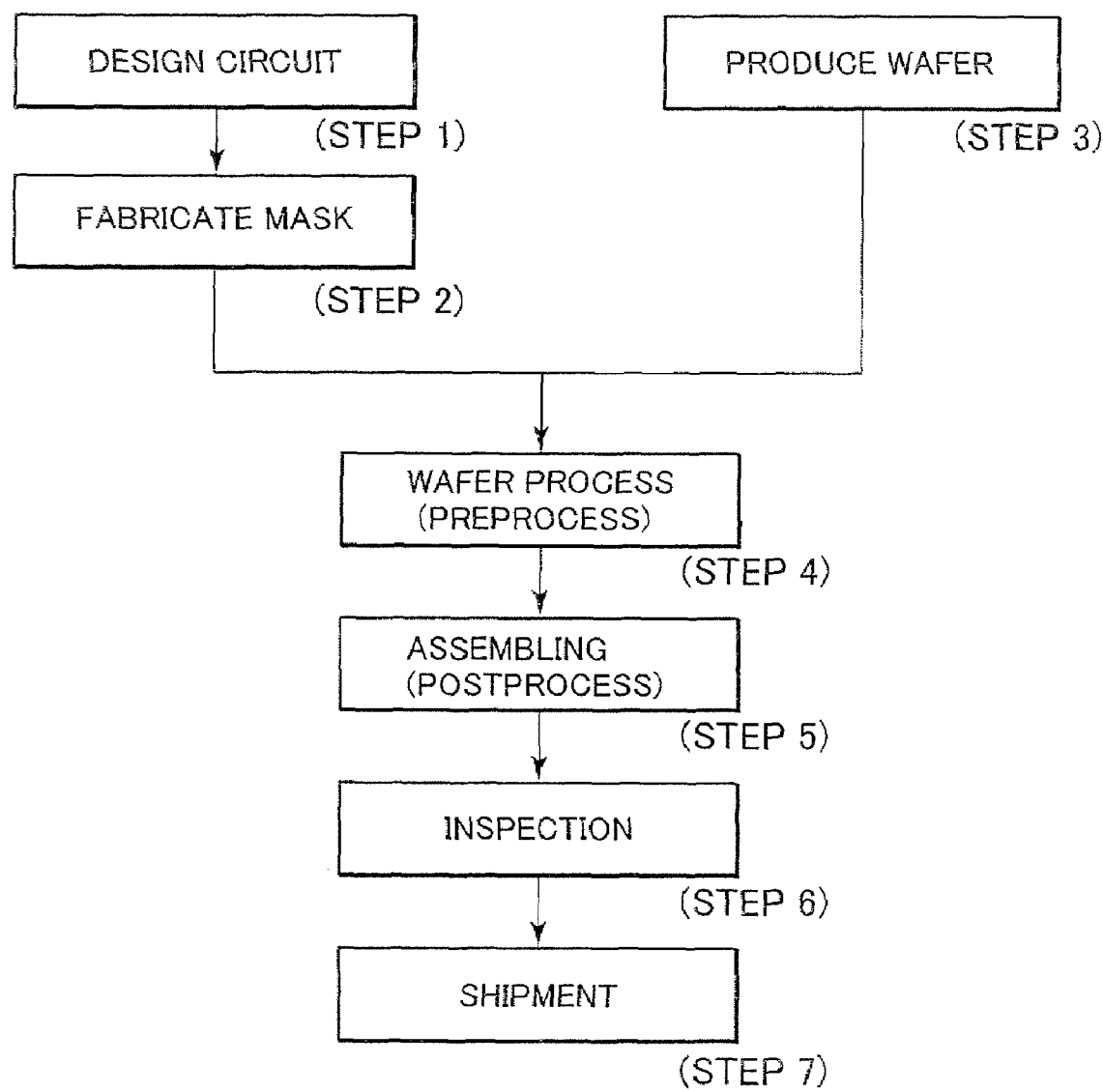
FIG. 20 is a view showing the flow chart of an entire production process for producing a semiconductor device.

Processes for producing semiconductor devices utilizing this exposure device will be explained hereafter. FIG. 20 is a view showing a flow chart of an entire production process for producing a semiconductor device. In Step 1 (design circuit), the circuit of a semiconductor device is designed. In Step 2 (fabricate mask), a mask is produced on the basis of the designed circuit.

In Step 3 (produce wafer), on the other hand, the wafer is made using a material, such as silicon, and the like. In Step 4 (wafer process), which is called preprocessing, an actual circuit is formed on the wafer using the above mask and wafer utilizing lithography with the above exposure device. In the next step, Step 5 (assembling), which is called post-processing, the wafer made in Step 4 is processed into semiconductor chips, including assembling (dicing and bonding), packaging (enclose chips), and other assembling steps. In Step 6 (inspection), the semiconductor devices produced in Step 5 are inspected to ascertain their operation and to test their durability and other attributes. The semiconductor devices are completed through these steps and shipped to destinations, in Step 7.

The wafer process of the above Step 4 includes an oxidizing step for oxidizing wafer surfaces, a chemical-vapor-deposition (CVD) step for forming insulating films on the wafer surfaces, an electrode forming step for forming electrodes on the wafer by vapor deposition, an ion driving step for driving ions into the wafer, a resist treating step for coating a photosensitive agent on the wafer, an exposure step for transcribing the circuit patterns on the wafer already subjected to the resist treating step by means of the above exposure device, a developing step for developing the wafer exposed in the exposure step, an etching step for removing portions except for the resist images developed in the exposure step, and a resist peeling step for removing the resist which has become unnecessary when the etching step has been completed By performing these steps repeatedly, circuit patterns can be formed on the wafer in a multiple manner.

Except as otherwise discussed herein, the various components shown in outline or in block form in the Figures are individually well known and their internal construction and operation are not critical either to the making or using or to a description of the best mode of the invention.

While the present invention has been described with reference to exemplary embodiments, it is to be understood that the invention is not limited to the disclosed embodiments. On the contrary, the invention is intended to cover various modifications and equivalent arrangements included within the spirit and scope of the appended claims. The scope of the following claims is to be accorded the broadest interpretation so as to encompass all such modifications and equivalent structures and functions.

This application claims priority from Japanese Patent Application No. #2004-089502 filed Mar. 25, 2004, which is hereby incorporated by reference herein.

What is claimed is:

1. A positioning device comprising:
    an object movable at least in X and Y directions;
    object position measuring means for measuring positions of the object;
    a first structure guiding the object in the Y direction and movable in the X direction;
    a second structure guiding the object in the X direction and movable in the Y direction; and
    at least two pairs of electromagnet units provided on the object in such a manner as to embrace side faces of the first structure and the second structure,
    wherein at least one of the first and second structures has a rotation regulating portion for regulating its rotation, the rotation regulating portion being movable with the at least one of the first and second structures.

2. The positioning device as set forth in claim 1, further comprising:
    magnetic members provided on side faces of the first and second structures, the magnetic members producing attracting forces between the magnetic members and the electromagnet units.

3. The positioning device as set forth in claim 1, wherein the object position measuring means is a laser interferometer.

4. The positioning device as set forth in claim 1, further comprising:
    a first interferometer configured to measure positions of the first structure in the X direction; and
    a second interferometer configured to measure positions of the second structure in the Y direction.

5. The positioning device as set forth in claim 4, further comprising:
    a reference position judging means configured to judge whether the object has arrived at a reference position.

6. An exposure device for positioning a substrate or a negative plate by use of a positioning device, the positioning device comprising:
    an object movable at least in X and Y directions;
    object position measuring means for measuring positions of the object;
    a first structure guiding the object in the Y direction and movable in the X direction;
    a second structure guiding the object in the X direction and movable in the Y direction; and
    at least two pairs of electromagnet units provided on the object in such a manner as to embrace side faces of the first structure and the second structure,
    wherein at least one of the first and second structures has a rotation regulating portion for regulating its rotation, the rotation regulating portion being movable with the at least one of the first and second structures.

7. A method of initializing a positioning device, said positioning device comprising:
- an object movable in first and second directions perpendicular to each other;
- object position measuring means for measuring positions of the object;
- a first structure guiding the object in the second direction and movable in the first direction;
- a second structure guiding the object in the first direction and movable in the second direction; and
- at least two pairs of electromagnet units provided on the object in such a manner as to embrace side faces of the first structure and the second structure,
- wherein at least one of the first and second structures has a rotation regulating portion for regulating its rotation;

the method comprising:
- a step of attracting the object to the structure whose rotation is regulated by the rotation regulation portion using the electro-magnetic units; and
- a step of offsetting the object position measuring means when the object is attracted in the attracting step.

8. The method of initializing a positioning device as set forth in claim 7, further comprising:
- a step of attracting the object to the other structure under a condition maintaining the object and the structure whose rotation is regulated by the rotation regulation portion in a predetermined relative positional relationship.

9. The method of initializing a positioning device as set forth in claim 7, the method comprising:
- a step of moving the other structure to a predetermined reference position under a condition maintaining the object and the structure whose rotation is regulated by the rotation regulation portion in a predetermined relative positional relationship.

* * * * *